(12) United States Patent
Kim

(10) Patent No.: US 11,526,298 B2
(45) Date of Patent: Dec. 13, 2022

(54) APPARATUS AND METHOD FOR CONTROLLING A READ VOLTAGE IN A MEMORY SYSTEM

(71) Applicant: SK hynix Inc., Gyeonggi-do (KR)

(72) Inventor: Dae Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/181,367

(22) Filed: Feb. 22, 2021

(65) Prior Publication Data

US 2022/0100413 A1 Mar. 31, 2022

(30) Foreign Application Priority Data

Sep. 29, 2020 (KR) .......................... 10-2020-0126823

(51) Int. Cl.
*G06F 3/06* (2006.01)
(52) U.S. Cl.
CPC .......... *G06F 3/0655* (2013.01); *G06F 3/0604* (2013.01); *G06F 3/0679* (2013.01)

(58) Field of Classification Search
CPC ..... G06F 3/0655; G06F 3/0604; G06F 3/0679
See application file for complete search history.

(56) References Cited

U.S. PATENT DOCUMENTS

| 8,898,553 | B1 | 11/2014 | Varnica et al. |
| 9,633,740 | B1 | 4/2017 | Alhussien et al. |
| 2017/0125110 | A1* | 5/2017 | Sankaranarayanan ...................... G11C 11/5642 |
| 2019/0076070 | A1* | 3/2019 | Nogueira ............... G16H 50/70 |
| 2020/0012561 | A1 | 1/2020 | Lu |
| 2020/0117536 | A1 | 4/2020 | Lu |

* cited by examiner

*Primary Examiner* — David Yi
*Assistant Examiner* — Nicholas A. Paperno
(74) *Attorney, Agent, or Firm* — IP & T Group LLP

(57) ABSTRACT

A memory system determines a level of a read voltage, which is used for reading or recognizing data stored in non-volatile memory cells, in response to a change of a threshold voltage distribution which gradually widens due to charge loss or charge transfer in the non-volatile memory cells over time, so that it is possible to provide an apparatus and method which can avoid or reduce an error in a read operation.

20 Claims, 6 Drawing Sheets

APPARATUS AND METHOD FOR CONTROLLING A READ VOLTAGE IN A MEMORY SYSTEM

CROSS-REFERENCE TO RELATED APPLICATION

This patent application claims the benefit of priority under 35 U.S.C. § 119 to Korean Patent Application No. 10-2020-0126823, filed on Sep. 29, 2020, the entire disclosure of which is incorporated herein by reference.

TECHNICAL FIELD

The disclosure relates to a memory system, and more specifically, an apparatus and a method for controlling a read voltage used in a memory device including non-volatile memory cells.

BACKGROUND

Recently, a paradigm for a computing environment has shifted to ubiquitous computing, which enables computer systems to be accessed virtually anytime and anywhere. As a result, the use of portable electronic devices, such as mobile phones, digital cameras, notebook computers, and the like, are rapidly increasing. Such portable electronic devices typically use or include a memory system that uses or embeds at least one memory device, i.e., a data storage device. The data storage device can be used as a main storage device or an auxiliary storage device of a portable electronic device.

Unlike a hard disk, a data storage device using a non-volatile semiconductor memory device is advantageous in that it has excellent stability and durability because it has no mechanical driving part (e.g., a mechanical arm), and has high data access speed and low power consumption. In the context of a memory system having such advantages, an exemplary data storage device includes a universal serial bus (USB) memory device, a memory card having various interfaces, a solid state drive (SSD), or the like.

BRIEF DESCRIPTION OF THE DRAWINGS

The description herein makes reference to the accompanying drawings wherein like reference numerals refer to like parts throughout the figures.

DETAILED DESCRIPTION

Figure 1:
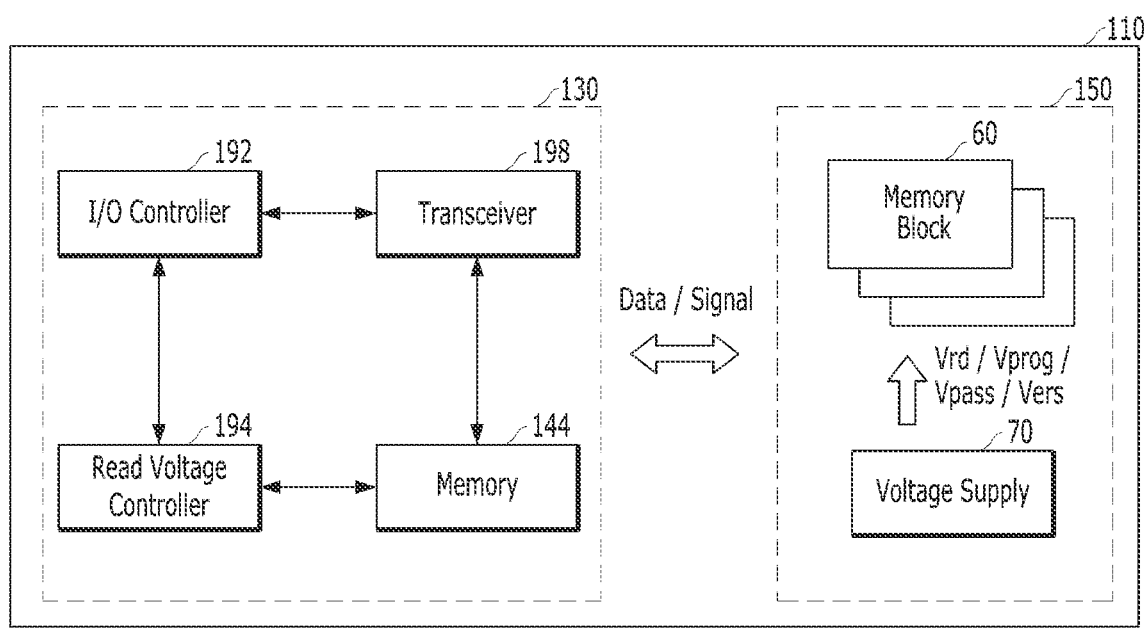
FIG. 1 illustrates a memory system according to an embodiment of the present disclosure.

Various embodiments of the present disclosure are described below with reference to the accompanying drawings. Elements and features of the present disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features that are included in one or more embodiments of the present disclosure, may or may not necessarily be combined in the same embodiments.

In this disclosure, the terms "comprise," "comprising," "include," and "including" are open-ended. As used herein, these terms specify the presence of the stated elements/components and do not preclude the presence or addition of one or more other elements/components.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, a block/unit/circuit/component can be said to be configured to perform the task even when the specified blocks/unit/circuit/component is not currently operational (e.g., is not on). The blocks/units/circuits/components used with the "configured to" language include hardware—for example, circuits, memory storing program instructions executable to implement the operation, etc. Additionally, the term "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' refers to any and all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

An embodiment of the present disclosure can provide a data processing system and a method for operating the data processing system, which includes components and resources such as a memory system and a host, and is capable of dynamically allocating plural data paths used for data communication between the components based on usages of the components and the resources.

In addition, a memory system according to an embodiment of the present disclosure may determine a level of a read voltage, which is used for reading or recognizing data stored in non-volatile memory cells, in response to a change of a threshold voltage distribution which gradually widens due to charge loss or charge transfer in the non-volatile memory cells over time, so that it is possible to provide an apparatus and method which can avoid or reduce an error in a read operation.

According to another embodiment of the present disclosure, a memory system may provide an apparatus and method capable of determining a level of a read voltage to reflect a change or shift of a threshold voltage distribution and accurately read or recognize data stored in non-volatile memory cells.

Further, a memory system according to an embodiment of the present disclosure determines a level of a read voltage used for recognizing or distinguishing data based on a standard deviation ratio of plural threshold voltage distributions which correspond to adjacent values of the data individually. In the memory system, an apparatus or a method is provided to effectively read data stored in non-volatile memory cells of a memory device even when standard deviations of the plural threshold voltage distribution are different from each other.

In an embodiment of the present disclosure, a memory system can include a memory device including a plurality of non-volatile memory cells; and a controller configured to obtain at least some of plural threshold voltage distributions corresponding to data stored in the plurality of non-volatile memory cells, determine a mean difference and a standard deviation ratio of the plural threshold voltage distributions, determine a read voltage level, which is used for recognizing the data, based on the mean difference and the standard deviation ratio, and perform a read operation on at least some of the plurality of non-volatile memory cells based on the read voltage level.

Each of the plurality of non-volatile memory cells can store multi-bit data. The plurality of threshold voltage distributions can include two threshold voltage distributions corresponding to two adjacent values of the multi-bit data.

The controller can be further configured to determine whether the standard deviation ratio is less than a preset threshold value.

The mean difference can be a difference between mean values of the plural threshold voltage distributions, and the controller is configured to determine the read voltage level based on a standardized value obtained by dividing a difference between a previous read voltage level and the mean difference by a standard deviation regarding one of the plural threshold voltage distributions.

The controller can be configured to, when the standard deviation ratio is greater than the preset threshold value, determine the read voltage level by a procedure of: subtracting a bias voltage level corresponding to a boundary value of a lowest section between the plural threshold voltage distributions from the previous read voltage level to obtain a subtracted value; dividing the subtracted value by the standard deviation regarding the one of the plural threshold voltage distributions to obtain a divided value; and adding the boundary value to a value obtained by multiplying the divided value by the standard deviation ratio, a result of the adding being the read voltage level.

The controller can be further configured to, when the standard deviation ratio is greater than the preset threshold value, shift the read voltage level in a direction of a mean of a threshold voltage distribution which has a smaller standard deviation between the plural threshold voltage distributions.

The controller can be configured to, when the standard deviation ratio is equal to, or less than, the preset threshold value, determine the read voltage level based on the mean difference.

The controller can be configured to, when the standard deviation ratio is equal to, or less than, the preset threshold value, determine the read voltage level which corresponds to a level, at which a number of non-volatile memory cells is minimum in a sum of the plural threshold voltage distributions.

The controller can be configured to obtain the plural threshold voltage distributions by: applying plural candidate read voltages having different levels to the plurality of non-volatile memory cells to distinguish the data of adjacent values and determining the plural threshold voltage distributions based on numbers of the plurality of non-volatile memory cells storing the data of adjacent values.

In another embodiment of the present disclosure, a method for operating a memory system can include obtaining at least some of plural threshold voltage distributions corresponding to data stored in a plurality of non-volatile memory cells in a memory device; determining a mean difference and a standard deviation ratio of the plural threshold voltage distributions; determining a read voltage level, which is used for recognizing the data, based on the mean difference and the standard deviation ratio; and performing a read operation on at least some of the plurality of non-volatile memory cells based on the read voltage level.

Each of the plurality of non-volatile memory cells can store multi-bit data. The plurality of threshold voltage distributions can include two threshold voltage distributions corresponding to two adjacent values of the multi-bit data.

The method can further include determining whether the standard deviation ratio is less than a preset threshold value.

The mean difference can be a difference between mean values of the plural threshold voltage distributions. The read voltage level is determined based on a standardized value obtained by dividing a difference between a previous read voltage level and the mean difference by a standard deviation regarding one of the plural threshold voltage distributions.

The determining of the read voltage level can include, when the standard deviation ratio is greater than the preset threshold value, subtracting a bias voltage level corresponding to a boundary value of a lowest section between the plural threshold voltage distributions from the previous read voltage level to obtain a subtracted value; dividing the subtracted value by the standard deviation regarding the one of the plural threshold voltage distributions to obtain a divided value; and adding the boundary value to a value obtained by multiplying the divided value by the standard deviation ratio, a result of the adding being the read voltage level.

The standard deviation ratio can be greater than the preset threshold value, the read voltage level is shifted in a direction of a mean of a threshold voltage distribution which has a smaller standard deviation between the plural threshold voltage distributions.

The read voltage level can be determined based on the mean difference when the standard deviation ratio is equal to, or less than, the preset threshold value.

The read voltage level can be determined to correspond to a level, at which a number of non-volatile memory cells is minimum in a sum of the plural threshold voltage distributions when the standard deviation ratio is equal to, or less than, the preset threshold value.

The obtaining of the plural threshold voltage distributions can include applying plural candidate read voltages having different levels to the plurality of non-volatile memory cells to distinguish the data of adjacent values; and determining the plural threshold voltage distributions based on numbers of the plurality of non-volatile memory cells storing the data of adjacent values.

In another embodiment of the present disclosure, a memory system can include a memory device including a plurality of non-volatile memory cells for storing data and a voltage supply circuit for supplying a read voltage to the plurality of non-volatile memory cells; and a controller configured to obtain at least some of plural threshold voltage distributions corresponding to data stored in the plurality of non-volatile memory cells, determine a mean difference and a standard deviation ratio of the plural threshold voltage distributions, determine a change of the read voltage, which is used for recognizing the data, based on the mean difference and the standard deviation ratio, and send the change of the read voltage to the memory device. The voltage supply circuit can be further configured to adjust a level of the read voltage based on the change of the read voltage and apply the adjusted level of the read voltage to the plurality of non-volatile memory cells.

The memory device can include a table including information regarding how to determine a level of at least one read voltage applicable to the plurality of non-volatile memory cells.

In another embodiment of the present disclosure, a memory system can include a memory device including memory cells; and a controller configured to control the memory device to read target data from at least a part of the memory cells according to a read voltage level determined based on a mean difference and a standard deviation ratio of neighboring threshold voltage distributions of at least the target data.

Embodiments of the present disclosure are described below with reference to the accompanying drawings, wherein like numbers reference refers to like elements.

FIG. 1 illustrates a memory system 110 according to an embodiment of the present disclosure.

Referring to FIG. 1, the memory system 110 may include a memory device 150 and a controller 130. The memory device 150 and the controller 130 may be considered physically distinct components or elements. In that case, the memory device 150 and the controller 130 may be connected via at least one data path. For example, the data path may include a channel and/or a way.

According to another embodiment, the memory device 150 and the controller 130 may be integrated into a single component or element but functionally divided. According to an embodiment, the memory device 150 and the controller 130 may be implemented with a single chip or a plurality of chips.

The memory device 150 may include a plurality of memory blocks 60, each of which contains a group of non-volatile memory cells in which data is erased together by a single erase operation. Although not illustrated, each of the memory blocks 60 may include pages, a single one of which is a group of non-volatile memory cells that are programmed in a single program operation or from which data is output in a single read operation.

Although not shown in FIG. 1, the memory device 150 may include a plurality of memory planes and/or a plurality of memory dies. According to an embodiment, a memory plane may be considered a logical or a physical partition which includes at least one memory block 60, a driving circuit capable of controlling an array including a plurality of non-volatile memory cells, and a buffer that can temporarily store data inputted to, or outputted from, non-volatile memory cells.

According to an embodiment, a memory die may include at least one memory plane. A memory die may be understood as a set of components implemented on a physically distinguishable substrate. Each memory die may be connected to the controller 130 through a data path. Each memory die may include an interface to exchange a piece of data and a signal with the controller 130.

The memory device 150 may be configured with any of various suitable ways in terms of memory block(s), memory plane(s) and memory die(s). The internal configuration of the memory device 150 is not limited to that shown in FIG. 1. In general, the configuration of the memory device 150 is determined by intended use and/or desired performance of the memory system 110.

Referring to FIG. 1, the memory device 150 may include a voltage supply circuit 70 capable of supplying at least one voltage into the memory block 60. The voltage supply circuit 70 may supply a read voltage Vrd, a program voltage Vprog, a pass voltage Vpass, or an erase voltage Vers into a non-volatile memory cell in the memory block 60. For example, during a read operation for reading data stored in the non-volatile memory cell in the memory block 60, the voltage supply circuit 70 may supply the read voltage Vrd into a selected non-volatile memory cell. During the program operation for storing data in the non-volatile memory cell in the memory block 60, the voltage supply circuit 70 may supply the program voltage Vprog into a selected non-volatile memory cell. During a read operation or a program operation performed on the selected nonvolatile memory cell, the voltage supply circuit 70 may supply a pass voltage Vpass into a non-selected nonvolatile memory cell. During the erase operation for erasing data stored in the non-volatile memory cell in the memory block 60, the voltage supply circuit 70 may supply the erase voltage Vers into the memory block 60.

The memory device 150 may store information regarding various voltages which are supplied to the memory block 60 based on which operation is performed. For example, when a non-volatile memory cell in the memory block 60 can store multi-bit data, plural levels of the read voltage Vrd for recognizing or reading the multi-bit data may be required. The memory device 150 may include a table including information corresponding to plural levels of the read voltage Vrd, corresponding to the multi-bit data. For example, the table can include bias values stored in a register, each bias value corresponding to a specific level of the read voltage Vrd. The number of bias values for the read voltage Vrd that is used for a read operation may be limited to a preset range. Also, the bias values can be quantized. In addition, the information described in the table may be updated or changed by a read voltage controller 194, which is described later. An operation related to the table is described with reference to FIGS. 4 and 5.

In order to store data requested by an external device (e.g., a host 102 in FIGS. 2-3) in the memory device 150 (e.g., a storage space including non-volatile memory cells), the memory system 110 may perform address translation between a file system used by the host 102 with a physical location of the storage space including the non-volatile memory cells. For example, a data address determined according to the file system used by the host 102 may be referred to as a logical address or a logical block address, while an address for the physical location at which data is stored in the storage space may be referred as to a physical address or a physical block address. When the host 102 transfers a logical address to the memory system 110 together with a read request, the memory system 110 searches for a physical address associated with the logical address, reads data stored in a location recognized by the physical address, and outputs read data to the host 102. During this procedure, address translation may be performed in the memory system 110 to search for the physical address associated with the logical address input from the host 102.

The controller 130 may perform a data input/output operation in response to a request input from an external device. For example, when the controller 130 performs a read operation in response to a read request input from the external device, data stored in a plurality of non-volatile memory cells in the memory device 150 is transferred to the controller 130. For the read operation, data input/output (I/O) circuitry 192 may perform address translation on the logical address input from the external device to obtain a physical address, and then transmit a read command to the memory device 150 corresponding to the physical address through a transceiver 198. The transceiver 198 may transmit the read command to the memory device 150 and receive data output from the memory device 150 corresponding to the physical address. The transceiver 198 may store data transferred from the memory device 150 in a memory (e.g., a memory 144 of FIG. 2). The data input/output circuitry 192 may output data stored in the memory to the external device in response to the read request.

The data input/output circuitry 192 may transmit user data input along with a write request from the external device to the memory device 150 through the transceiver 198. After storing the data in the memory device 150, the data input/output circuitry 192 may transmit a response corresponding to the write request to the external device. The data input/output circuitry 192 may update map data that associates the physical address, which indicates a location where the user data in the memory device 150 is stored, with the logical address input along with the write request.

A non-volatile memory cell included in the memory device 150 may have a specific threshold voltage corresponding to data. Data stored in each of the non-volatile memory cells may be 1-bit data (e.g., 1-bit data having a value '0' or '1'), or multi-bit data (e.g., two-bit data having values '00', '01', '11', '10'). A threshold voltage distribution regarding each value (e.g., '00', '01', '11' or '10') of the data is generated. A pair of the values '00' and '01', a pair of values '01' and '11', a pair of values '11' and '10' may be considered a pair of adjacent values. Threshold voltage distributions on the plurality of non-volatile memory cells may be changed or modified due to charge loss or charge transfer occurring over time. The charge loss or charge transfer may occur more easily when a program (write) and erase cycle of the memory device 150 increases (e.g., when wear of the non-volatile memory cells is more critical). Deformation of the threshold voltage distribution may cause an error in a read operation. Accordingly, the controller 130 may obtain plural threshold voltage distributions on the plurality of non-volatile memory cells in the memory device 150 and determine a level of the read voltage in response to a change of the threshold voltage distribution. By adjusting a level of the read voltage, an error in the read operation can be avoided or reduced.

The read voltage controller 194 in the controller 130 may obtain at least some of threshold voltage distribution which corresponds to data stored in the memory 144 during a read operation performed by the input/output controller 192. For example, 2-bit data is stored in each of the plurality of non-volatile memory cells. The plurality of non-volatile memory cells may have four threshold voltage distributions corresponding to four values of data (e.g., '00', '01', '11', and '10'). When two adjacent threshold voltage distributions among the four threshold voltage distributions do not overlap, the read voltage may be determined to have a voltage level between the two threshold voltage distributions. The memory cells belonging to the two adjacent threshold voltage distributions may be completely distinguished by the read voltage, so that no error may occur in a read operation for reading data corresponding to the two threshold voltage distributions.

However, when the two adjacent threshold voltage distributions are deformed and the two adjacent threshold voltage distributions are partially overlapped, the number of errors may be different according to a level of the read voltage. The read voltage controller 194 is configured to determine a mean difference and a standard deviation ratio of the two adjacent threshold voltage distributions and determine a level of the read voltage used for reading or recognizing data based on the mean difference and the standard deviation ratio.

Figure 2:
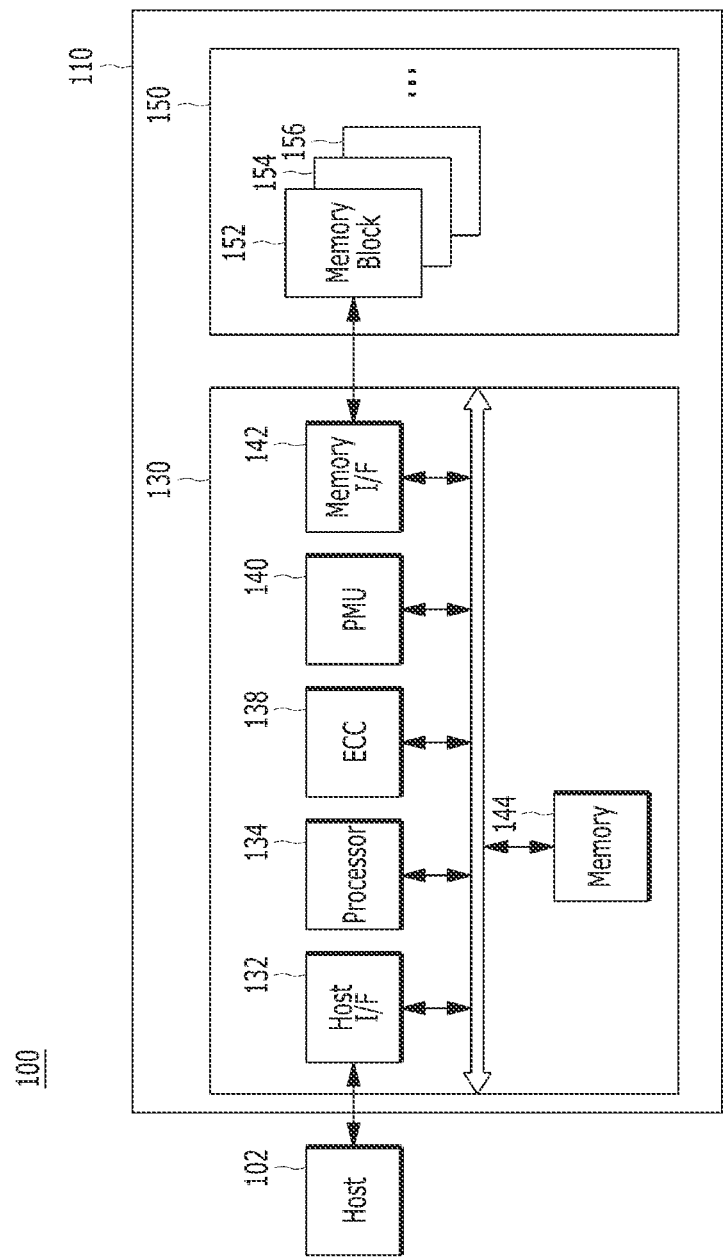
FIG. 2 illustrates a data processing system according to an embodiment of the present disclosure.

According to an embodiment, the read voltage controller 194 may be included in an error correction circuitry 138 of the controller 130 described in FIG. 2, or the read voltage controller 194 may include the error correction circuitry 138. After reading data stored in the plurality of non-volatile memory cells in the memory device 150, there is no need to change a level of the read voltage if there is no error in the read data. However, if there are many errors in the read data, the number of errors can be reduced by changing the level of the read voltage and using a changed level of the read voltage for reading the data stored in the non-volatile memory cell. An operation for changing a level of the read voltage will be described later with reference to FIGS. 4 to 7.

Figure 3:
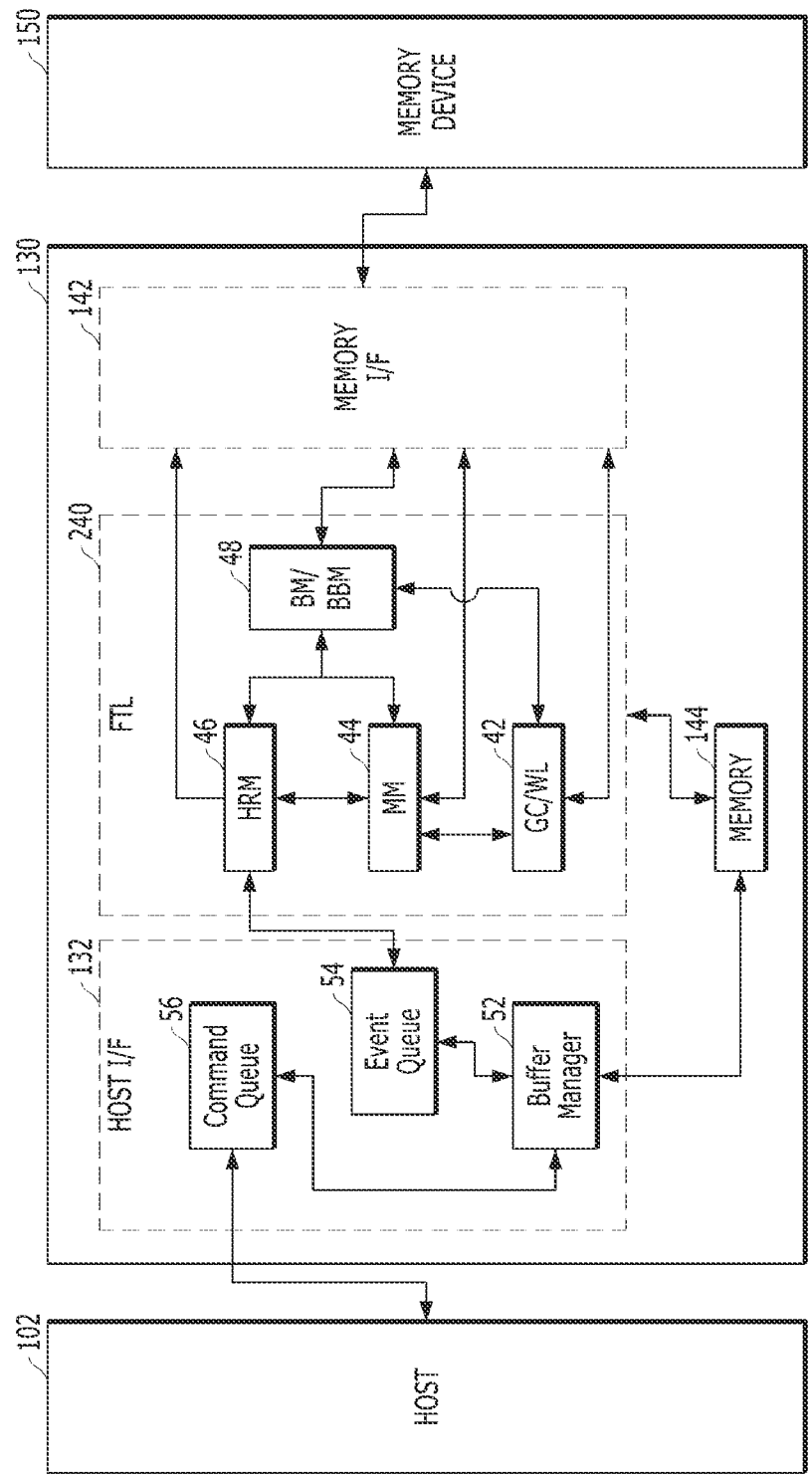
FIG. 3 illustrates a memory system according to an embodiment of the present disclosure.

FIGS. 2 and 3 illustrate some operations that may be performed by a memory system 110 in a data processing system 100 according to one or more embodiments of the present disclosure.

Referring to FIG. 2, the data processing system 100 may include a host 102 operably engaged with the memory system 110. The host 102 may include a portable electronic device (e.g., a mobile phone, an MP3 player, a laptop computer, etc.) or a non-portable electronic device (e.g., a desktop computer, a game player, a television, a projector, etc.).

The host 102 may also include at least one operating system (OS), which can control functions and operations performed in the host 102. The OS can provide interoperability between the host 102 engaged operatively with the memory system 110 and the user who intends to store data in the memory system 110. The OS may support functions and operations corresponding to user requests. By way of example but not limitation, the OS can be a general operating system and/or a mobile operating system according to mobility of the host 102. The general operating system may be a personal operating system and/or an enterprise operating system according to system requirements or a user environment. As compared with the personal operating system, the enterprise operating system can be specialized for securing and supporting high performance computing.

The mobile operating system may support services or functions for mobility (e.g., a power saving function). The host 102 may include a plurality of operating systems. The host 102 may execute multiple operating systems interlocked with the memory system 110, corresponding to a user request. The host 102 may transmit a plurality of commands corresponding to the user's requests into the memory system 110, thereby performing operations corresponding to commands within the memory system 110.

The controller 130 in the memory system 110 may control the memory device 150 in response to a request or a command input from the host 102. For example, the controller 130 may perform a read operation to provide a piece of data read from the memory device 150 for the host 102 and may perform a write operation (or a program operation) to store a piece of data input from the host 102 in the memory device 150. In order to perform data input/output (I/O) operations, the controller 130 may control and manage internal operations for data read, data program, data erase, or the like.

According to an embodiment, the controller 130 may include a host interface (I/F) 132, a processor 134, error correction circuitry (i.e., ECC) 138, a power management unit (PMU) 140, a memory interface 142, and a memory 144. The components of the controller 130 are not limited to those illustrated in FIG. 2. Rather, the configuration of the controller 130 may vary according structure, function, operation performance, or the like, of the memory system 110. For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. The specific set of components in the controller 130 may be different depending on the particular implementation of the memory system 110.

The host 102 and the memory system 110 may include a controller or an interface for transmitting and receiving signals, a piece of data, and the like, in accordance with one or more communication protocols. For example, the host interface 132 in the memory system 110 may include an apparatus capable of transmitting signals, a piece of data, and the like, to the host 102 or receiving signals, a piece of data, and the like, input from the host 102.

The host interface 132 may receive signals, commands (or requests), and/or a piece of data input from the host 102. For example, the host 102 and the memory system 110 may use a communicate protocol to transmit and receive a piece of data between each other. Examples of protocols or interfaces supported by the host 102 and the memory system 110 for sending and receiving a piece of data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIE or PCIe), Serial-attached SCSI (SAS), Serial Advanced Technology Attachment (SATA), Mobile Industry Processor Interface (MIPI), and the like. According to an embodiment, the host interface 132 is a type of layer for exchanging a piece of data with the host 102 and is implemented with, or driven by, firmware called a host interface layer (HIL).

In some embodiments, Integrated Drive Electronics (IDE) or Advanced Technology Attachment (ATA) may be used as one of the interfaces for transmitting and receiving a piece of data between the host 102 and the memory system 110. For example, IDE or ATA may use a cable including 40 wires connected in parallel to support data transmission and reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as the main memory device. For example, IDE (or ATA) may include Fast-ATA, ATAPI, and Enhanced IDE (EIDE).

Serial Advanced Technology Attachment (SATA) is a type of serial data communication interface that is compatible with various ATA standards of parallel data communication interfaces which is used by Integrated Drive Electronics (IDE) devices. The 40 wires in the IDE interface can be reduced to six wires in the SATA interface. For example, 40 parallel signals for the IDE can be converted into 6 serial signals for SATA to be transmitted between each other. SATA has been widely used because of its faster data transmission and reception rate and its less resource consumption in the host 102 used for data transmission and reception. SATA may support connections with up to 30 external devices to a single transceiver included in the host 102. In addition, SATA can support hot plugging that allows an external device to be attached or detached from the host 102, even while data communication between the host 102 and another device is being executed. Thus, the memory system 110 may be connected or disconnected as an additional device, like a device supported by a universal serial bus (USB) even when the host 102 is powered on. For example, in the host 102 having an eSATA port, the memory system 110 may be freely detached like an external hard disk.

Small Computer System Interface (SCSI) is a type of serial data communication interface used for connection between a computer, a server, and/or other peripheral devices. SCSI can provide a high transmission speed, as compared with other interfaces such as IDE and SATA. In SCSI, the host 102 and at least one peripheral device (e.g., memory system 110) are connected in series, but data transmission and reception between the host 102 and each peripheral device may be performed through a parallel data communication. In SCSI, it is easy to connect to, or disconnect from, the host 102 a device such as the memory system 110. SCSI can support connections of 15 other devices to a single transceiver included in host 102.

Serial Attached SCSI (SAS) can be understood as a serial data communication version of the SCSI. In SAS, not only the host 102 and a plurality of peripheral devices are connected in series, but also data transmission and reception between the host 102 and each peripheral device may be performed in a serial data communication scheme. SAS can support a connection between the host 102 and the peripheral device through a serial cable instead of a parallel cable, to easily manage equipment using SAS and enhance or improve operational reliability and communication performance. SAS may support connections of eight external devices to a single transceiver in the host 102.

Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. PCIe can use a slot or a specific cable for connecting the host 102 (e.g., a computing device) and the memory system 110 (e.g., a peripheral device). For example, PCIe can use a plurality of pins (for example, 18 pins, 32 pins, 49 pins, 82 pins, etc.) and at least one wire (e.g. ×1, ×4, ×8, ×16, etc.) to achieve high speed data communication over several hundred MB per second (e.g. 250 MB/s, 500 MB/s, 984.6250 MB/s, 1969 MB/s, and etc.). According to an embodiment, the PCIe scheme may achieve bandwidths of tens to hundreds of Giga bits per second. A system using the NVMe can make the most of an operation speed of the non-volatile memory system 110, such as an SSD, which operates at a higher speed than a hard disk.

According to an embodiment, the host 102 and the memory system 110 may be connected through a universal serial bus (USB). USB is a kind of scalable, hot-pluggable plug-and-play serial interface that can provide cost-effective standard connectivity between the host 102 and a peripheral device, such as a keyboard, a mouse, a joystick, a printer, a scanner, a storage device, a modem, a video camera, and the like. A plurality of peripheral devices such as the memory system 110 may be coupled to a single transceiver in the host 102.

Referring to FIG. 2, the error correction circuitry 138 may correct error bits of the data to be processed in (e.g., output from) the memory device 150, which may include an error correction code (ECC) encoder and an ECC decoder. The ECC encoder may perform error correction encoding of data to be programmed in the memory device 150 to generate encoded data into which a parity bit is added and store the encoded data in memory device 150. The ECC decoder may detect and correct errors contained in data read from the memory device 150 when the controller 130 reads the data stored in the memory device 150. For example, after performing error correction decoding on the data read from the memory device 150, the error correction circuitry 138 may determine whether the error correction decoding has succeeded and output an instruction signal (e.g., a correction success signal or a correction fail signal). The error correction circuitry 138 may use a parity bit generated during the ECC encoding process for correcting the error bit of the read data. When the number of the error bits is greater than or equal to a threshold number of correctable error bits, the error correction circuitry 138 might not correct error bits but instead may output an error correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and the like. The error correction circuitry 138 may include all circuits, modules, systems, and/or devices for performing the error correction operation based on at least one of the above described codes.

For example, the ECC decoder may perform hard decision decoding or soft decision decoding to data transmitted from the memory device 150. The hard decision decoding can be understood as one of two methods (i.e., the hard decision decoding and the soft decision decoding) broadly classified for error correction. The hard decision decoding may include an operation of correcting an error by reading each bit or piece of digital data from a non-volatile memory cell in the memory device 150 as either '0' or '1'. Because the hard decision decoding handles a binary logic signal, the circuit/algorithm design or configuration may be simpler and processing speed may be faster than soft decision decoding.

Soft decision decoding may quantize a threshold voltage of a non-volatile memory cell in the memory device 150 by two or more quantized values (e.g., multiple bit data, approximate values, an analog value, and the like) in order to correct an error based on the two or more quantized values. The controller 130 may receive two or more alphabets or quantized values from a plurality of non-volatile memory cells in the memory device 150, and then perform decoding based on information generated by characterizing the quantized values as a combination of information such as conditional probability or likelihood.

According to an embodiment, the ECC decoder may use a low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like hard decision decoding, and iteratively repeats it through message exchange in order to improve reliability of the values. Then, each bit is finally determined as 1 or 0. For example, a decoding algorithm using LDPC codes provides probabilistic decoding. Through hard decision decoding, the value output from a non-volatile memory cell is determined as 0 or 1. Compared to hard decision decoding, soft decision decoding may determine the value stored in the non-volatile memory cell based on the stochastic information. Regarding bit-flipping (which may be considered an error that can occur in the memory device 150), soft decision decoding may provide improved probability of correcting error and recovering data, as well as provide reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) code for soft decision decoding. LDPC-CCs code may use a linear time encoding scheme and pipeline decoding based on a variable block length and a shift register.

According to an embodiment, the ECC decoder may use, for example, a Log Likelihood Ratio Turbo Code (LLR-TC) for soft decision decoding. Log Likelihood Ratio (LLR) may be calculated as a non-linear function for a distance between a sampled value and an ideal value. In addition, Turbo Code (TC) may include a simple code (for example, a Hamming code) in two or three dimensions and repeat decoding in a row direction and a column direction to improve reliability of values.

The power management unit (PMU) 140 may control electrical power provided in the controller 130. The PMU 140 may monitor the electrical power supplied to the memory system 110 (e.g., a voltage supplied to the controller 130) and provide the electrical power to components in the controller 130. The PMU 140 can not only detect power-on or power-off, but also can generate a trigger signal to enable the memory system 110 to back up a current state urgently when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory. For example, when the memory device 150 includes a NAND flash memory, the memory interface 142 includes a NAND flash controller (NFC). The memory interface 142 may provide an interface for handling commands and data between the controller 130 and the memory device 150. In accordance with an embodiment, the memory interface 142 may be implemented through, or driven by, firmware called a flash interface layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 may be achieved through at least one interface regarding an asynchronous single data rate (SDR), a synchronous double data rate (DDR), and a toggle double data rate (DDR). An operation for transferring or receiving information used for determining a level of read voltage described in FIG. 1 can be performed by interface modules included in the controller 130 and the memory device 150.

The memory 144 may be a type of working memory in the memory system 110 or the controller 130, while storing temporary or transactional data for operations in the memory system 110 and the controller 130. For example, the memory 144 may temporarily store read data output from the memory device 150 in response to a request from the host 102, before the read data is output to the host 102. In addition, the controller 130 may temporarily store write data input from the host 102 in the memory 144, before programming the write data in the memory device 150. When the controller 130 controls operations such as data read, data write, data program, or data erase of the memory device 150, a piece of data transmitted or generated between the controller 130 and the memory device 150 of the memory system 110 may be stored in the memory 144.

In addition to the read data or write data, the memory 144 may store information (e.g., map data, read requests, program requests, etc.) used for inputting or outputting data between the host 102 and the memory device 150. According to an embodiment, the memory 144 may include a command queue, a program memory, a data memory, a write buffer/cache, a read buffer/cache, a data buffer/cache, a map buffer/cache, and/or the like. The controller 130 may allocate some storage space in the memory 144 for a component which is used to carry out a data input/output operation. For example, the write buffer in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates the memory 144 disposed within the controller 130, the embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control overall operation of the memory system 110. For example, the processor 134 may control a program operation or a read operation on the memory device 150, in response to a write request or a read request input from the host 102. According to an embodiment, the processor 134 may execute firmware to control the program operation or the read operation on the memory system 110. Herein, the firmware may be referred to as a flash translation layer (FTL). An example of the FTL is described below in detail, referring to FIG. 3. According to an embodiment, the processor 134 may be implemented with a microprocessor or a central processing unit (CPU).

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, data input/output speed (or performance) of the memory system 110 may be improved. According to an embodiment, the data input/output (I/O) operations in the memory system 110 may be independently performed through different cores in the multi-core processor.

The processor 134 may perform an operation corresponding to a request or a command input from the host 102. Further, the memory system 110 may be independent of a command or a request input from an external device such as the host 102. In one case, an operation performed by the controller 130 in response to the request or the command input from the host 102 may be considered a foreground operation, while an operation performed by the controller 130 independently (e.g., without a request or command input from the host 102) may be considered a background operation. The controller 130 may perform foreground or background operations for read, write or program, erase and the like, regarding data in the memory device 150. In addition, a parameter set operation corresponding to a set parameter command or a set feature command as a set command transmitted from the host 102 may be considered a foreground operation. As a background operation without a command transmitted from the host 102, the controller 130 may perform garbage collection (GC), wear leveling (WL), bad block management for identifying and processing bad blocks of a plurality of memory blocks 152, 154, 156 in the memory device 150.

According an embodiment, substantially similar operations may be performed as both the foreground operation and the background operation. For example, when the memory system 110 performs garbage collection in response to a request or a command input from the host 102 (e.g., Manual GC), garbage collection may be considered a foreground operation. When the memory system 110 performs garbage collection independently of the host 102 (e.g., Auto GC), garbage collection may be considered a background operation.

When the memory device 150 includes a plurality of dies (or a plurality of chips) including non-volatile memory cells, the controller 130 may be configured to perform parallel processing regarding plural requests or commands input from the host 102 to improve performance of the memory system 110. For example, the transmitted requests or commands may be distributed to a plurality of dies or a plurality of chips in the memory device 150 and processed simultaneously. The memory interface 142 may be connected to a plurality of dies or chips in the memory device 150 through at least one channel and at least one way. When the controller 130 distributes and stores data in the plurality of dies through each channel or each way in response to requests or a commands associated with a plurality of pages including non-volatile memory cells, plural operations corresponding to the requests or the commands may be performed simultaneously or in parallel. Such a processing method or scheme may be considered as an interleaving method. Because data input/output speed of the memory system 110 operating with the interleaving method may be faster than that without the interleaving method, data I/O performance of the memory system 110 may be improved.

By way of example but not limitation, the controller 130 may recognize statuses regarding a plurality of channels (or ways) associated with a plurality of memory dies in the memory device 150. The controller 130 may determine the status of each channel or each way as one of, for example, a busy status, a ready status, an active status, an idle status, a normal status, and/or an abnormal status. The determination of which channel or way an instruction (and/or a data) is delivered through by the controller 130 may be associated with a physical block address, e.g., which die(s) the instruction (and/or the data) is delivered into. The controller 130 may refer to descriptors delivered from the memory device 150. The descriptors may include a block or page of parameters that describe something about the memory device 150, which is data with a set format or structure. For instance, the descriptors may include device descriptors, configuration descriptors, unit descriptors, and the like. The controller 130 may refer to, or use, the descriptors to determine which channel(s) or way(s) an instruction or a data is exchanged via.

The memory device 150 may include the plurality of memory blocks 152, 154, 156. Each of the plurality of memory blocks 152, 154, 156 includes a plurality of non-volatile memory cells. According to an embodiment, the memory block 152, 154, 156 may be a group of non-volatile memory cells erased together. The memory block 152, 154, 156 may include a plurality of pages which is a group of non-volatile memory cells read or programmed together. In one embodiment, each memory block 152, 154, 156 may have a three-dimensional stack structure for a high integration. Further, the memory device 150 may include a plurality of dies, each die including a plurality of planes, each plane including the plurality of memory blocks, e.g., some of all memory blocks 152, 154, 156 in the memory device 150. Configuration of the memory device 150 may be different for different desired performances of the memory system 110. Herein, the plurality of memory blocks 152, 154, 156 may correspond to the memory block 60 described in FIG. 1.

Each of the plurality of memory blocks 152, 154, 156 may be a single-level cell (SLC) memory block, or a multi-level cell (MLC) Cell) memory block, according to the number of bits that can be stored or represented in one memory cell of that block. An SLC memory block includes a plurality of pages implemented by memory cells, each storing one bit of data. An SLC memory block may have high data I/O operation performance and high durability. An MLC memory block includes a plurality of pages implemented by memory cells, each storing multi-bit data (e.g., two bits or more). An MLC memory block may have larger storage capacity for the same space compared to an SLC memory block. Thus, an MLC memory block may be highly integrated in view of storage capacity.

In an embodiment, the memory device 150 may be implemented with MLC memory blocks such as double level cell (DLC) memory blocks, triple-level cell (TLC) memory blocks, quadruple-level cell (QLC) memory blocks or a combination thereof. A double-level cell (DLC) memory block may include a plurality of pages implemented by memory cells, each capable of storing 2-bit data. A triple-level cell (TLC) memory block may include a plurality of pages implemented by memory cells, each capable of storing 3-bit data. A quadruple-level cell (QLC) memory block may include a plurality of pages implemented by memory cells, each capable of storing 4-bit data. In another embodiment, the memory device 150 may be implemented with one or more blocks, each of which include a plurality of pages implemented by memory cells, each capable of storing five or more bits of data.

According to an embodiment, the controller 130 may use a multi-level cell (MLC) memory block in the memory device 150 as an SLC memory block. A data input/output speed of the multi-level cell (MLC) memory block may be slower than that of the SLC memory block. That is, when an MLC memory block is used as an SLC memory block, a margin for a read or program operation (e.g., operation-timing margin) may be reduced. The controller 130 may utilize a faster data input/output speed of an MLC memory block when using the MLC memory block as an SLC memory block. For example, the controller 130 may use an MLC memory block as a buffer to temporarily store a piece of data, because the buffer may require a high data input/output speed for improving performance of the memory system 110.

According to an embodiment, the controller 130 may program pieces of data in a multi-level cell (MLC) a plurality of times without performing an erase operation on a specific MLC memory block in the memory device 150. Non-volatile memory cells have a feature that does not support data overwrite. However, the controller 130 may use a feature in which an MLC may store multi-bit data, in order to program plural pieces of 1-bit data in the MLC a plurality of times. For an overwrite operation for MLC, the controller 130 may store the number of program times as separate operation information when a single piece of 1-bit data is programmed in a non-volatile memory cell. According to an embodiment, an operation for uniformly levelling threshold voltages of non-volatile memory cells may be carried out before another piece of data is overwritten in the same non-volatile memory cells.

In an embodiment, the memory device 150 may be embodied as a non-volatile memory such as a flash memory, for example, as a NAND flash memory, a NOR flash memory, and the like. In an embodiment, the memory device 150 may be implemented by at least one of a phase change random access memory (PCRAM), a ferroelectrics random access memory (FRAM), a spin injection magnetic memory, and a spin transfer torque magnetic random access memory (STT-MRAM), or the like.

Referring to FIG. 3, the controller 130 in a memory system operates along with the host 102 and the memory device 150. As illustrated, the controller 130 includes a flash translation layer (FTL) 240, in addition to a host interface 132, the memory interface 142, and the memory 144, which were previously identified in connection with FIG. 2.

According to an embodiment, the error correction circuitry 138 in FIG. 2 may be included in the flash translation layer (FTL) 240. In another embodiment, the error correction circuitry 138 may be implemented as a separate module, a circuit, or firmware, which is included in, or associated with, the controller 130.

The host interface 132 may be capable of handling commands, and data transmitted from the host 102. By way of example but not limitation, the host interface 132 may include a command queue 56, a buffer manager 52, and an event queue 54. The command queue 56 may sequentially store commands, and data, which are received from the host 102, and output them to the buffer manager 52, for example, in the order in which they are stored. The buffer manager 52 may classify, manage, or adjust the commands, and the data, which are received from the command queue 56. The event queue 54 may sequentially transmit events for processing the commands and the data received from the buffer manager 52.

A plurality of commands or data of the same characteristic (e.g., read or write commands) may be transmitted from the host 102, or plurality of commands and data of different characteristics may be transmitted to the memory system 110 after being mixed or jumbled by the host 102. For example, a plurality of commands for reading data (read commands) may be delivered, or commands for reading data (read command) and programming/writing data (write command) may be alternately transmitted to the memory system 110. The host interface 132 may store commands and data, which are transmitted from the host 102, to the command queue 56 sequentially. Thereafter, the host interface 132 may estimate or predict what type of internal operation the controller 130 will perform according to the characteristics of commands and data, which have been received from the host 102. The host interface 132 may determine a processing order and a priority of commands and data, based at least on their characteristics.

According to characteristics of commands and data, which are transmitted from the host 102, the buffer manager 52 in the host interface 132 may determine whether the buffer manager 52 should store commands and data, in the memory 144, or whether the buffer manager 52 should deliver the commands and the data to the flash translation layer 240. The event queue 54 may receive events from the buffer manager 52, which are to be internally executed and processed by the memory system 110 or the controller 130 in response to the commands and the data, which are transmitted from the host 102, in order to deliver the events to the flash translation layer 240 in the order received.

In accordance with an embodiment, the flash translation layer (FTL) 240 illustrated in FIG. 3 may implement a multi-thread scheme to perform the data input/output (I/O) operations. A multi-thread FTL may be implemented through a multi-core processor using multi-thread in the controller 130.

In accordance with an embodiment, the flash translation layer (FTL) 240 may include the data input/output circuitry 192, while the memory interface 142 may include the transceiver 198.

In accordance with an embodiment, the flash translation layer 240 may include a host request manager (HRM) 46, a map manager (MM) 44, a state manager 42, and a block manager 48. The host request manager (HRM) 46 may manage the events from the event queue 54. The map manager (MM) 44 may handle or control a map data. The state manager 42 may perform garbage collection (GC) or wear leveling (WL). The block manager 48 may execute commands or instructions on a block in the memory device 150.

By way of example but not limitation, the host request manager (HRM) 46 may use the map manager (MM) 44 and the block manager 48 to handle or process requests according to the read and program commands, and events which are delivered from the host interface 132. The host request manager (HRM) 46 may send an inquiry request to the map manager (MM) 44, to determine a physical address corresponding to the logical address which is received with the events. The host request manager (HRM) 46 may send a read request with the physical address to the memory interface 142, to process the read request (handle the events). In one embodiment, the host request manager (HRM) 46 may send a program request (write request) to the block manager 48 to program data to a specific empty page (no data) in the memory device 150, and then may transmit a map update request corresponding to the program request to the map manager (MM) 44, in order to update an item relevant to the programmed data in information of mapping the logical-physical addresses to each other.

The block manager 48 may convert a program request delivered from the host request manager (HRM) 46, the map data manager (MM) 44, and/or the state manager 42 into a flash program request used for the memory device 150, in order to manage flash blocks in the memory device 150. In order to maximize or enhance program or write performance of the memory system 110, the block manager 48 may collect program requests and send flash program requests for multiple-plane and one-shot program operations to the memory interface 142. In an embodiment, the block manager 48 sends several flash program requests to the memory interface 142 to enhance or maximize parallel processing of the multi-channel and multi-directional flash controller.

In one embodiment, the block manager 48 may be configured to manage blocks in the memory device 150 according to the number of valid pages, select and erase blocks having no valid pages when a free block is needed, and select a block including the least number of valid pages when it is determined that garbage collection is to be performed. The state manager 42 may perform garbage collection to move the valid data from the selected block(s) to an empty block and erase the block(s) containing the moved valid data so that the block manager 48 may have enough free blocks (i.e., empty blocks with no data). When the block manager 48 provides information regarding a block to be erased to the state manager 42, the state manager 42 may check all flash pages of the block to be erased to determine whether each page is valid.

For example, to determine validity of each page, the state manager 42 may identify a logical address recorded in an out-of-band (OOB) area of each page. To determine whether each page is valid, the state manager 42 may compare the physical address of the page with the physical address mapped to the logical address obtained from the inquiry request. The state manager 42 sends a program request to the block manager 48 for each valid page. A mapping table may be updated through the update of the map manager 44 when the program operation is complete.

The map manager 44 may manage a logical-to-physical (L2P) mapping table. The map manager 44 may process various requests, for example, queries and updates, which are generated by the host request manager (HRM) 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made and the dirty map table may be stored in the memory device 150.

When garbage collection is performed, the state manager 42 copies valid page(s) into a free block, and the host request manager 46 may program the latest version of the data for the same logical address of the page and currently issue an update request. When the state manager 42 requests the map update in a state in which copying of valid page(s) has not been properly completed, the map manager 44 might not perform the mapping table update. This is because the map request is issued with old physical information when the state manager 42 requests a map update and a valid page copy is completed later. The map manager 44 may perform a map update operation to ensure accuracy when, and only if, the latest map table still points to the old physical address.

Figure 4:
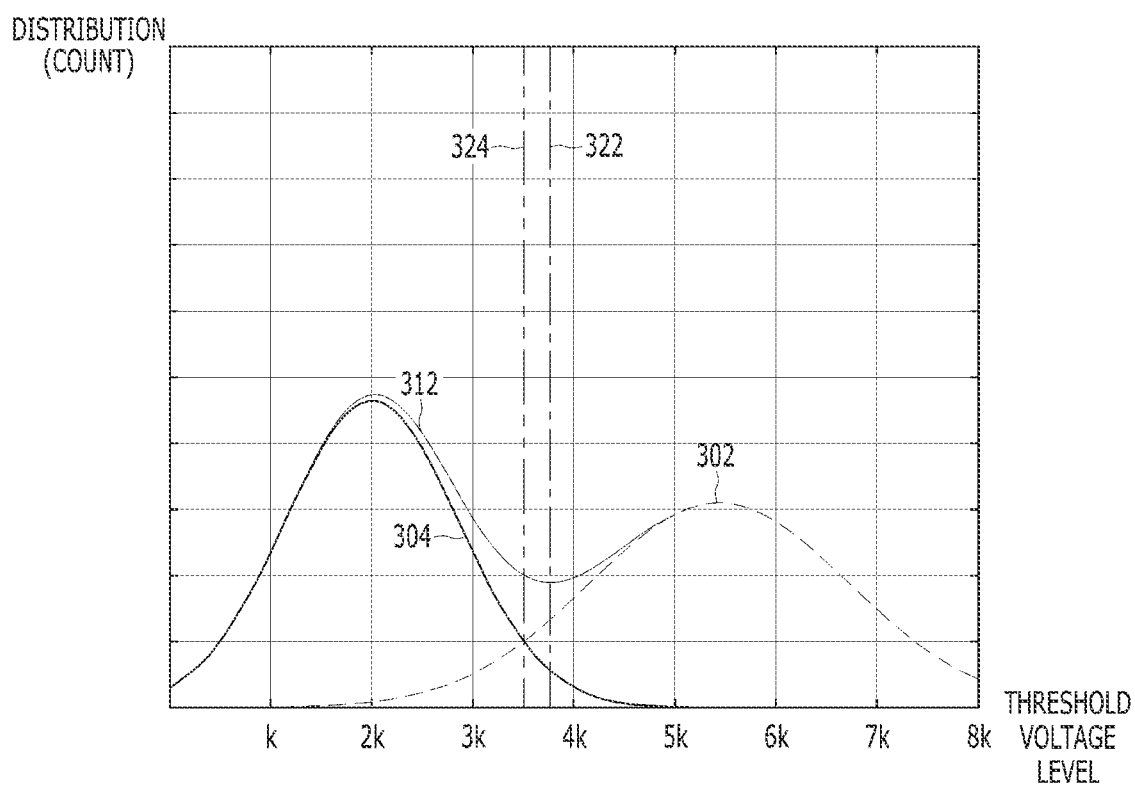
FIG. 4 illustrates a first example of a method for determining a level of a read voltage used for a read operation.

FIG. 4 illustrates a first example of a method for determining a level of a read voltage used for a read operation. Specifically, FIG. 4 illustrates a part of threshold voltage distributions on a plurality of non-volatile memory cells included in the memory device 150. The number of threshold voltage distributions may be different according to how many bit data are stored in the non-volatile memory cell. For example, in a case of a non-volatile memory cell storing 1-bit data, the controller 130 may obtain or collect a first threshold voltage distribution corresponding to data '1' and a second threshold voltage distribution corresponding to data '0'. In another case of a non-volatile memory cell storing 2-bit data, the controller 130 may obtain or collect four threshold voltage distributions corresponding to four values of data (e.g., '00', '01', '11', '10'). In FIG. 4, a part in which two adjacent threshold voltage distributions may be partially overlapped among a plurality of threshold voltage distributions will be described. The adjacent threshold voltage distribution may represent data of the adjacent values. For convenience of description, the two adjacent threshold voltage distributions correspond to data '0' and data '1'.

Referring to FIG. 4, the controller 130 obtains two threshold voltage distributions 302 and 304 corresponding to two values of data (e.g., '0' and '1') stored in the plurality of non-volatile memory cells. When the two threshold voltage distributions 302 and 304 are partially overlapped, an error may occur when the controller 130 reads data by applying the read voltage Vrd to the plurality of non-volatile memory cells. In order to avoid or reduce the error, it is preferable that a level of the read voltage Vrd is determined corresponding to a level at which the two threshold voltage distributions 302 and 304 intersect with each other. However, it may be very difficult to find out or recognize the level at which the two adjacent threshold voltage distributions 302 and 304 intersect with each other.

Over time, threshold voltage distributions corresponding to data stored in the plurality of non-volatile memory cells may be changed. If all of the plural threshold voltage distributions are shifted or changed in a same direction (e.g., a direction in which the threshold voltage decreases or increases), or the standard deviations of the plural threshold voltage distributions (e.g., a high, narrow, low, or wide shape of each distribution) are uniformly changed, it may not be difficult for the controller 130 or the memory device 150 to determine an appropriate level of the voltage Vrd. However, in the memory system 110, plural threshold voltage distributions corresponding to data stored in the plurality of non-volatile memory cells may shift or move in different directions or by different amounts. Further, standard deviations of the plural threshold voltage distributions can be differently changed.

According to an embodiment, in order to read data corresponding to the two threshold voltage distributions 302 and 304, a mean value of the threshold voltage distribution may be used. For example, the controller 130 obtains mean values of two adjacent threshold voltage distributions and then obtains a mean difference, i.e., a difference between the mean values. A level of the read voltage Vrd may be determined by dividing the mean difference in half. For example, the adjacent threshold voltage distributions have the characteristic of a Gaussian distribution and left and right standard deviations (a difference in the low or high threshold voltage with reference to the voltage level corresponding to the mean value) which are substantially the same or less between the adjacent threshold voltage distributions than a preset threshold range. In this case, a level of the read voltage Vrd may be determined corresponding to a level at which the number of non-volatile memory cells is the smallest in a sum of the adjacent threshold voltage distributions. When the standard deviations of adjacent threshold voltage distributions are substantially the same or has a difference less than a preset threshold, the level of the read voltage Vrd determined in this way (i.e., dividing the mean difference in half) can avoid or reduce an error during an operation of reading data from the plurality of non-volatile memory cells.

Referring to FIG. 4, a mean value of the first threshold voltage distribution 304 among two adjacent threshold voltage distributions 302 and 304 is 2 k, and a mean value of the second threshold voltage distribution 302 is located between 5 k and 6 k. For convenience, the mean value of the second threshold voltage distribution 302 is 5.5 k. A difference between the mean values of the two threshold voltage distributions 302 and 304 is 3.5 k (=5.5 k−2 k), so that a level of the read voltage is 3.75 k (=2 k+3.5 k/2) which is calculated by dividing the mean difference in half and then added to the mean value of the first threshold voltage distribution 304. However, it is difficult to say that a level 322 of the read voltage Vrd calculated in this way is optimized to read or recognize data (e.g., '0' or '1') corresponding to the two adjacent threshold voltage distributions 302 and 304.

As above described, standard deviations of the adjacent threshold voltage distributions may be substantially the same with each other or have a difference less than or equal to a preset threshold range. Or, the standard deviations of the adjacent threshold voltage distributions may be different or have a difference greater than or equal to a preset threshold range. These situations can occur due to an operating environment of the memory system 110 and operating characteristics made during a manufacturing process of the memory device 150. Referring to FIG. 4, when the two adjacent threshold voltage distributions have different standard deviations (a standard deviation difference which is greater than the preset threshold range), an optimized level of the read voltage Vrd used for reading data corresponding to the two threshold voltage distributions 302 and 304, which is a level at which the two threshold voltage distributions 302 and 304 intersects, can be biased toward a threshold voltage distribution having a smaller standard deviation from the level 322 of the read voltage Vrd that is calculated based on the mean values only.

According to an embodiment, the controller 130 may calculate standard deviations of the plural threshold voltage distributions and determine a standard deviation ratio between the plural threshold voltage distributions. The controller 130 can be configured to add a correction value, into which the standard deviation ratio is reflected, to the level 322 of the read voltage Vrd calculated based on the difference of mean values, to determine the level of the read voltage Vrd for reading data corresponding to the two threshold voltage distributions 302 and 304. Accordingly, the level of the read voltage Vrd can be adjusted to a level 324 corresponding to an intersection point of the two threshold voltage distributions.

Specifically, the plural threshold voltage distributions are normal distributions whose parameters have a mean of µ and a standard deviation of σ. Here, µ indicates a mean value of the distribution, and σ may indicate a degree to which the distribution is scattered (how far data are separated from the mean µ in the distribution). That is, as the standard deviation σ of the distribution increases, the shape of the distribution spreads to the side. As the standard deviation σ decreases, the shape of the distribution centering around the mean µ becomes sharper because the distribution is concentrated on the mean value. For example, a normal distribution with a mean value µ=0 and a standard deviation σ=1 is called the standard normal distribution or unit normal distribution.

The mean value of the first threshold voltage distribution 304 is µ1 and the standard deviation of the first threshold voltage distribution 304 is σ1. Further, the mean value of the second threshold voltage distribution 302 is µ2 and the standard deviation of the second threshold voltage distribution 302 is σ2. Based on the mean values µ1 and µ2 and standard deviations σ1 and σ2 of the first and second threshold voltage distributions 302 and 304, a standardized value (e.g., a value representing how far data is separated from the mean value µ with reference to the standard deviation σ) may be obtained.

The standardization of any normal distribution can help in comparison of that normal distribution to a standard normal distribution. For example, to standardize a normally distributed random variable, the controller 130 may need to calculate its Z-score (i.e., Z=(X−µ)/σ). The Z-score can be calculated by using two steps: (1) the mean of X is subtracted from X; then (2) the resulting subtracted value is divided by the standard deviation of X.

First, a first standardized value can be obtained by standardizing a difference between the mean values µ1 and µ2 of the first and second threshold voltage distributions 302 and 304. The first standardized value may be calculated by Equation 1 below. The first standardized value calculated through Equation 1 can be used as an input to a table including a compensation value established in advance when the table is stored in the memory device 150 shown in FIG. 1.

$$\frac{\mu_2 - \mu_1}{\sigma_1} \quad \text{(Equation 1)}$$

A second standardized value can be obtained by standardizing a standard deviation ratio of the first and second threshold voltage distributions 302 and 304. The second standardized value may be calculated by Equation 2 below. The second standardized value can be used as another input to the table including the compensation value established in advance.

$$\frac{\sigma_2}{\sigma_1} \quad \text{(Equation 2)}$$

Moreover, µ1, which is the mean value of the first threshold voltage distribution 304, may be smaller than µ2 which is the mean value of the second threshold voltage distribution 302, but vice versa. Correspondingly, roles or positions of the standard deviation σ1 and the standard deviation σ2 can be changed in the equations for calculating the first and second standardized values.

In the memory system, a previously optimized level $R_{opt}$ of the read voltage Vrd and a bias voltage $R_{min}$ corresponding to a lowest section boundary value Bin (shown in FIG. 5) between the first and second threshold voltage distributions 302 and 304 can be used for calculating an amount by which the read voltage Vrd should be shifted. In an embodiment, a value corresponding to the amount by which the read voltage Vrd is shifted can be calculated by Equation 3 below. The Equation 3 can be understood as a mathematical definition for generating the table for determining an optimized level of the read voltage Vrd.

$$\beta = (R_{opt} - R_{min})/\sigma_1 \quad \text{(Equation 3)}$$

Using the value β calculated through the above-described process, the controller 130 can calculate a value obtained by standardizing an optimized level of the read voltage Vrd through Equation 4 below. The Equation 4 may show how to determine a level $\overline{R}_{opt}$ of read voltage Vrd based on a standardized value $\overline{\sigma}_1$ regarding for the standard deviation ratio (see Equation 2) and a bias voltage $\overline{R}_{min}$ corresponding to the lowest section boundary value (Bin) that can be estimated in real time, (e.g., the controller 130 can gather the bias voltage $\overline{R}_{min}$ through an algorithm for determining the read voltage).

$$\overline{R}_{opt} = \overline{R}_{min} + \beta \cdot \overline{\sigma}_1 \quad \text{(Equation 4)}$$

Based on a standardized value for the optimized level $\overline{R}_{opt}$ of the read voltage Vrd, the controller 130 can determine a difference between the previously optimized level $R_{opt}$ and the optimized level $\overline{R}_{opt}$ of the read voltage Vrd respectively before and after the change of threshold voltage distributions.

Referring back to FIG. 4, the standard deviation σ1 of the first threshold voltage distribution 304 is less than the standard deviation σ2 of the second threshold voltage distribution 302. In this case, through the above-described processes, the optimized level $\overline{R}_{opt}$ of the read voltage Vrd can be adjusted with reference to the level 322 of the read voltage Vrd, which is calculated based on the mean difference only, toward the mean value µ1 of the threshold voltage distribution 304 having a smaller standard deviation σ1. That is, the controller 130 may adjust a level of the read voltage Vrd to be closer to the position 324 corresponding to the intersection point of the two adjacent threshold voltage distributions 302 and 304.

Figure 5:
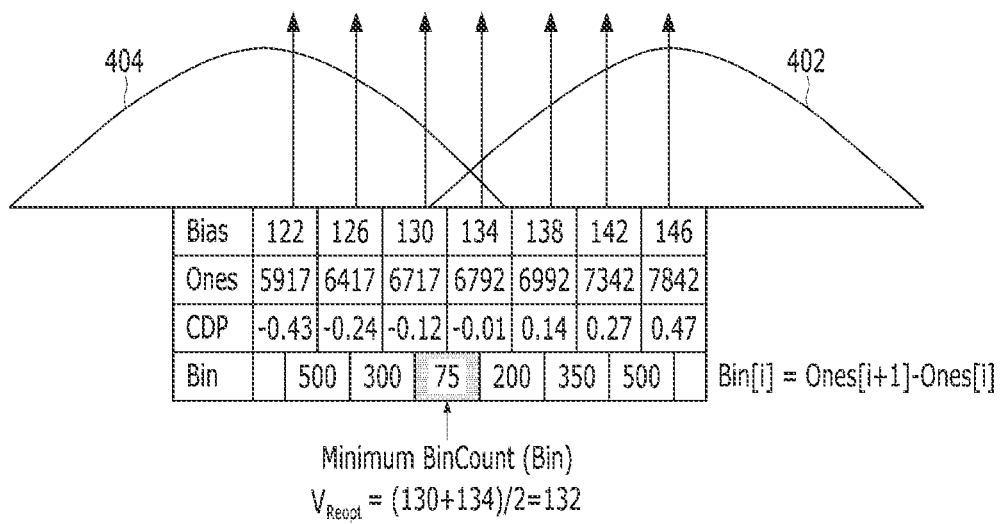
FIG. 5 illustrates a second example of the method of determining the level of the read voltage used for a read operation.

FIG. 5 illustrates a second example of the method of determining the level of the read voltage used for a read operation. In FIG. 5, similarly to FIG. 4, two adjacent threshold voltage distributions 402, 404 are partially overlapped with each other.

Referring to FIG. 5, the controller 130 may apply plural levels of read voltages to the plurality of non-volatile memory cells to track a change in the number of non-volatile memory cells based on the plural levels of read voltage. Here, the plural levels of read voltages Bias may be divided into randomly assigned numbers of 122, 126, 130, 134, 138, 142, 146. For example, the lower the assigned number, the lower the level of the read voltage (Bias), and the higher the assigned number, the higher the level of the read voltage (Bias). According to an embodiment, the number of 2's complement schemes may be individually allocated to the plural levels of read voltage Bias. According to an embodiment, a difference between two assigned numbers may indicate a difference in corresponding levels of the read voltage Bias. In FIG. 5, the plural levels of read voltage Bias having a uniform difference (e.g., '4') are applied to the plurality of non-volatile memory cells in the memory device 150.

When plural levels of the read voltage Bias are applied to a plurality of non-volatile memory cells, the controller 130 can determine or count the number of non-volatile memory cells Ones which are determined to have data of '1' in response to their threshold voltages. In addition, a cell difference probability (CDP) may be calculated when the plural levels of the read voltage Bias are individually applied to the plurality of non-volatile memory cells.

The number of non-volatile memory cells Ones which are recognized that data of '1' is stored therein can correspond to the plural levels of read voltages Bias. Based on the number of non-volatile memory cells Ones, the controller 130 can obtain a boundary value Bin[i] corresponding to the plural levels of read voltages Bias. Referring to FIG. 5, a difference in the number of non-volatile memory cells corresponding to two adjacent levels of read voltage Bias can be understood as a boundary value Bin for a section corresponding to the two adjacent levels of read voltage Bias.

The controller 130 can obtain boundary values Bin for a plurality of sections corresponding to the plural levels of read voltage Bias, and then can select the one having the lowest boundary value. Referring to FIG. 5, the two levels of the read voltage Bias corresponding to the lowest boundary value '75' are 130 and 134, and dividing sum of them (130+134) in half is 132. That is, the optimized level $V_{Reopt}$ of the read voltage Vrd may be determined as the level of the read voltage Bias corresponding to 132.

Figure 6:
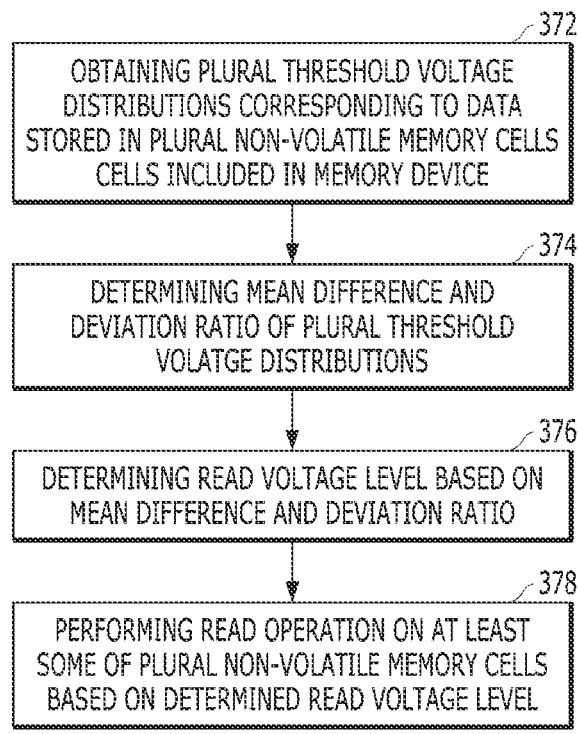
FIG. 6 illustrates a third example of the method of determining the level of the read voltage used for a read operation.

FIG. 6 illustrates a third example of the method of determining the level of the read voltage used for a read operation.

Referring to FIG. 6, the method of determining the read voltage can include obtaining plural threshold voltage distributions corresponding to data stored in a plurality of non-volatile memory cells in a memory device (372), determining a mean difference and a standard deviation ratio of the plural threshold voltage distributions (374), determining a level of the read voltage for reading or recognizing data based on the mean difference and the standard deviation ratio (376), and performing a read operation on at least some of the plurality of non-volatile memory cells based on the determined level of the read voltage (378).

Referring back to FIGS. 1 to 5, the controller 130 may determine the level Bias of read voltages Vrd applied to the plurality of non-volatile memory cells in the memory device 150. The controller 130 can be configured to apply various levels of read voltages Vrd to the plurality of non-volatile memory cells included in the memory device 150, to recognize threshold voltages of the plurality of non-volatile memory cells, and obtain or calculate at least some of plural threshold voltage distributions on the plurality of non-volatile memory cells (372). According to an embodiment, the controller 130 or the memory device 150 may be configured to determine data stored in the non-volatile memory cell during a manufacturing process. A range of the threshold voltage corresponding to the data stored in the non-volatile memory cell may be set during the manufacturing process. Also, a change of the threshold voltage may be roughly predicted according to operating characteristics of the memory device 150 which may be made during the manufacturing process. In response to the operating characteristics of the memory device 150, a level and an adjusted amount of the read voltage Vrd may be set or established, and this information may be stored in the memory device 150. The controller 130 may roughly estimate or calculate a threshold voltage distribution corresponding to data through a preset algorithm based on the information stored in the memory device 150 (372).

The controller 130 may determine mean values of the plural threshold voltage distributions and calculate standard deviations of the plural threshold voltage distributions (374). Here, the plural threshold voltage distributions may include two adjacent or neighboring threshold voltage distributions. When calculating the standard deviations of the plural threshold voltage distributions, the controller 130 can determine whether the two adjacent or neighboring threshold voltage distributions are substantially the same, or whether a standard deviation difference of the two adjacent or neighboring threshold voltage distributions is smaller than, or equal to, a preset threshold range or the standard deviation difference is beyond the preset threshold range. For example, as shown in FIG. 4, the controller 130 may check whether the two adjacent or neighboring threshold voltage distributions have different shapes rather than the same shape (e.g., one is sharp, but the other is spread).

The controller 130 may determine a level of the read voltage, which is used for reading or recognizing data stored in the plurality of non-volatile memory cells, in different ways based on the mean difference and the standard deviation ratio. For example, when two neighboring threshold voltage distributions are substantially the same or have a standard deviation difference smaller than or equal to a preset threshold range, it might not be necessary to adjust a level of the read voltage based on the standard deviation ratio of the two neighboring threshold voltage distributions. However, when the two neighboring threshold voltage distributions have a standard deviation difference greater than the preset threshold range, it is necessary to adjust the level of the read voltage based on the standard deviation ratio. An operation of adjusting the level of the read voltage based on the mean difference and the standard deviation ratio may be described in FIGS. 4 and 5. When the standard deviation difference of the plurality of threshold voltage distributions is greater than the preset threshold range, the controller 130 may move or shift a level of the read voltage toward the mean value of the threshold voltage distribution having a smaller standard deviation among the two neighboring threshold voltage distributions based on the standard deviation ratio. On the other hand, when the standard deviations of the plurality of threshold voltage distributions are substantially the same, the controller 130 may determine a level of the read voltage as a level, at which a number of non-volatile memory cells is minimum in the sum of the two neighboring threshold voltage distributions.

After determining the level of the read voltage, the controller 130 may perform a read operation on at least some of the plurality of non-volatile memory cells (378). Here, the read operation may be performed by an internal operation (e.g., garbage collection, bed block management, etc.) performed independently within the memory system 110 or, the read operation may be performed by the read request sent by the host 102 to the memory system 110. In addition, regarding data received through a read operation performed after the level of the read voltage is determined, the controller 130 can perform a hard decision decoding through an error correction circuitry 138, described in FIG. 2, to check whether an error is included in the data.

According to an embodiment, when a non-volatile memory cell in the memory device 150 stores multi-bit data, there may be several levels of the read voltage used to read or recognize the multi-bit data. The controller 130 may perform an operation for finding all optimized levels of the read voltage or an operation for finding some optimized levels of the read voltage.

Figure 7:
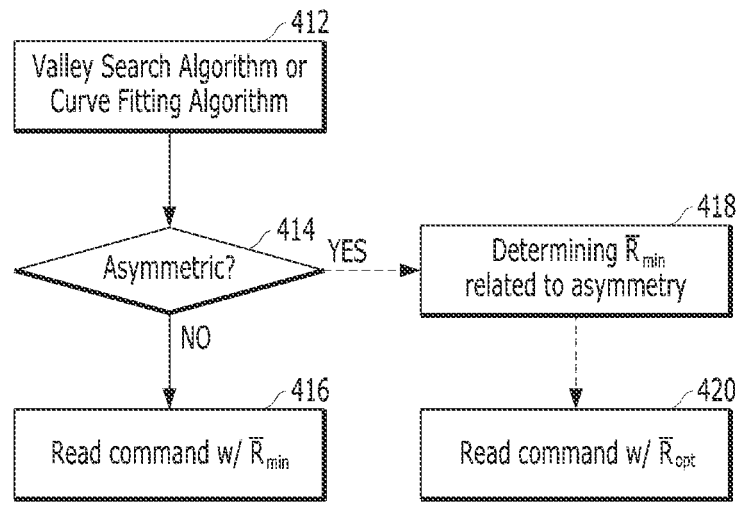
FIG. 7 illustrates a fourth example of the method of determining the level of the read voltage used for a read operation.

FIG. 7 illustrates a fourth example of the method of determining the level of the read voltage used for a read operation. The method of determining the level of the read voltage described in FIG. 7 can differently reflect the standard deviation ratio of the plural threshold voltage distributions in response to whether the standard deviations of the plurality of threshold voltage distributions are symmetrical or asymmetric, in order to appropriately determine the level of the read voltage.

Referring to FIG. 7, the method of determining the read voltage can include performing a Valley Search Algorithm or a Curve Fitting Algorithm (412) and determining whether a neighboring threshold voltage distribution is symmetric (414).

The Valley Search Algorithm can be used for performing an operation to find an optimal read voltage level. The Valley Search Algorithm is a type of operation for finding a valley between plural threshold voltage distributions after the plural threshold voltage distributions are obtained. As a simple example, a level at which a number of non-volatile memory cells is the smallest in the sum of neighboring threshold voltage distributions may correspond to a level of the valley to be found. In addition, the Curve Fitting Algorithm is a type of operation for finding a function that best represents values obtained from measured experimental values or statistical data. The Curve Fitting Algorithm can be used when estimating a value at a point between discrete data. In the Curve Fitting Algorithm, the value can be calculated with a functional expression that can most appropriately represent the given data. For example, least squares regression analysis or interpolation can be used depending on a shape of the distribution and a shape of the curve. The Valley Search Algorithm or the Curve Fitting Algorithm is presented as an example that the controller 130 can perform to obtain at least some of the threshold voltage distribution, however embodiments of the present disclosure are not be limited thereto.

The controller 130 may utilize the standard deviations of the neighboring threshold voltage distributions to determine whether the neighboring threshold voltage distributions are symmetric (414). When the standard deviations of the neighboring threshold voltage distributions are substantially the same, it may be determined that the neighboring threshold voltage distributions are symmetrical. On the other hand, when the standard deviations of the neighboring threshold voltage distributions are different (beyond the present range), it may be determined that the neighboring threshold voltage distributions are asymmetric.

When the neighboring threshold voltage distributions are symmetrical according to a determination result (414), the controller 130 can calculate a bias voltage $\overline{R}_{min}$ corresponding to the lowest section threshold value Bin regarding the neighboring threshold voltage distributions and transfer the bias voltage $\overline{R}_{min}$ along with a read command to the memory device 150 (416). The bias voltage $\overline{R}_{min}$ corresponding to the lowest section boundary value Bin of the neighboring threshold voltage distributions may be determined through the above-described Valley Search Algorithm or Curve Fitting Algorithm.

On the other hand, when the neighboring threshold voltage distributions are asymmetric according to the determination result (414), the controller 130 can determine the bias voltage $\overline{R}_{min}$ corresponding to the lowest section boundary value (Bin) of the neighboring threshold voltage distribution and a standardized value obtained by standardizing the standard deviation ratio or the standard deviations (418). Here, the standardized value may be determined through the Equation 2 above described. Thereafter, the controller 130 may determine a level of the read voltage for reading or recognizing data based on the mean difference and the standard deviation ratio (e.g., refer to Equations 3 and 4 described above). Detailed operations or processes of determining the level of the read voltage can be shown by referring to FIGS. 4 and 5. For example, the controller 130 may notify the memory device 150 as to how much the level of the read voltage should be adjusted or shifted, if the memory device 150 includes a table regarding read voltage levels. The controller 130 may determine the level of the read voltage and, then, transmit the change amount $\overline{R}_{opt}$ of the read voltage Vrd together with a read command to the memory device 150 (420).

In an embodiment of the disclosure, a memory system or a data processing system can support a faster data input/output speed or a faster data processing speed.

Further, a memory system according to an embodiment of the present disclosure can avoid or reduce failure of a read operation performed in a memory device including non-volatile memory cells, thereby improving or enhancing operating performance of the memory system.

While the present teachings have been illustrated and described with respect to specific embodiments, it will be apparent to those skilled in the art in light of the present disclosure that various changes and modifications may be made without departing from the spirit and scope of the invention as defined in the following claims.

What is claimed is:
1. A memory system, comprising:
   a memory device including a plurality of non-volatile memory cells; and
   a controller coupled to the memory device via a data path and configured to:
   obtain at least some of plural threshold voltage distributions corresponding to data which is stored in the plurality of non-volatile memory cells and transferred via the data path, determine a mean difference and a standard deviation ratio of the plural threshold voltage distributions, determine a read voltage level, which is used for recognizing the data, based on the mean difference and the standard deviation ratio, and control the memory device for performing a read operation on at least some of the plurality of non-volatile memory cells based on the read voltage level, wherein the controller is configured to determine whether the standard deviation ratio is less than a preset threshold value, and, when the standard deviation ratio is greater than the preset threshold value, shift the read voltage level in a direction of a mean of a threshold voltage distribution which has a smaller standard deviation between the plural threshold voltage distributions to determine the read voltage level.

2. The memory system according to claim 1, wherein each of the plurality of non-volatile memory cells stores multi-bit data, and wherein the plurality of threshold voltage distributions includes two threshold voltage distributions corresponding to two adjacent values of the multi-bit data.

3. The memory system according to claim 1, wherein the mean difference is a difference between mean values of the plural threshold voltage distributions, and wherein the controller is configured to determine the read voltage level based on a standardized value obtained by dividing a difference between a previous read voltage level and the mean difference by a standard deviation regarding one of the plural threshold voltage distributions.

4. The memory system according to claim 3, wherein the controller is configured to, when the standard deviation ratio is greater than the preset threshold value, determine the read voltage level by a procedure of:

subtracting a bias voltage level corresponding to a boundary value of a lowest section between the plural threshold voltage distributions from the previous read voltage level to obtain a subtracted value;

dividing the subtracted value by the standard deviation regarding the one of the plural threshold voltage distributions to obtain a divided value; and adding the boundary value to a value obtained by multiplying the divided value by the standard deviation ratio, a result of the adding being the read voltage level.

5. The memory system according to 1, wherein the controller is configured to, when the standard deviation ratio is equal to or less than the preset threshold value, determine the read voltage level based on the mean difference.

6. The memory system according to claim 1, wherein the controller is configured to, when the standard deviation ratio is equal to or less than the preset threshold value, determine the read voltage level which corresponds to a level, at which a number of non-volatile memory cells is minimum in a sum of the plural threshold voltage distributions.

7. The memory system according to claim 1, wherein the controller is configured to obtain the plural threshold voltage distributions by:

applying plural candidate read voltages having different levels to the plurality of non-volatile memory cells to distinguish the data of adjacent values, and determining the plural threshold voltage distributions based on numbers of the plurality of non-volatile memory cells storing the data of adjacent values.

8. A method for controlling a memory system comprising a memory device coupled via a data path, the method comprising:

obtaining at least some of plural threshold voltage distributions corresponding to data which is stored in a plurality of non-volatile memory cells in the memory device and transferred via the data path;

determining a mean difference and a standard deviation ratio of the plural threshold voltage distributions;

determining a read voltage level, which is used for recognizing the data, based on the mean difference and the standard deviation ratio by determining whether the standard deviation ratio is less than a preset threshold value, and, when the standard deviation ratio is greater than the preset threshold value, shifting the read voltage level in a direction of a mean of a threshold voltage distribution which has a smaller standard deviation between the plural threshold voltage distributions; and controlling the memory device for performing a read operation on at least some of the plurality of non-volatile memory cells based on the read voltage level.

9. The method according to claim 8, wherein each of the plurality of non-volatile memory cells stores multi-bit data, and wherein the plurality of threshold voltage distributions includes two threshold voltage distributions corresponding to two adjacent values of the multi-bit data.

10. The method according to claim 8, wherein the mean difference is a difference between mean values of the plural threshold voltage distributions, and wherein the read voltage level is determined based on a standardized value obtained by dividing a difference between a previous read voltage level and the mean difference by a standard deviation regarding one of the plural threshold voltage distributions.

11. The method according to claim 10, wherein the determining of the read voltage level includes, when the standard deviation ratio is greater than the preset threshold value:

subtracting a bias voltage level corresponding to a boundary value of a lowest section between the plural threshold voltage distributions from the previous read voltage level to obtain a subtracted value;

dividing the subtracted value by the standard deviation regarding the one of the plural threshold voltage distributions to obtain a divided value; and adding the boundary value to a value obtained by multiplying the divided value by the standard deviation ratio, a result of the adding being the read voltage level.

12. The method according to claim 8, wherein the read voltage level is determined based on the mean difference when the standard deviation ratio is equal to or less than the preset threshold value.

13. The method according to claim 8, wherein the read voltage level is determined to correspond to a level, at which a number of non-volatile memory cells is minimum in a sum of the plural threshold voltage distributions when the standard deviation ratio is equal to or less than the preset threshold value.

14. The method according to claim 8, wherein the obtaining of the plural threshold voltage distributions includes:

applying plural candidate read voltages having different levels to the plurality of non-volatile memory cells to distinguish the data of adjacent values; and determining the plural threshold voltage distributions based on numbers of the plurality of non-volatile memory cells storing the data of adjacent values.

15. A memory system, comprising:
a memory device including a plurality of non-volatile memory cells for storing data and a voltage supply circuit for supplying a read voltage to the plurality of non-volatile memory cells; and
a controller coupled to the memory device via a data path and configured to:
obtain at least some of plural threshold voltage distributions corresponding to data which is stored in the plurality of non-volatile memory cells and transferred via the data path,
determine a mean difference and a standard deviation ratio of the plural threshold voltage distributions,
determine a change of the read voltage, which is used for recognizing the data, based on the mean difference and the standard deviation ratio by determining whether the standard deviation ratio is less than a preset threshold value, and, when the standard deviation ratio is greater than the preset threshold value, shifting the read voltage level in a direction of a mean of a threshold voltage distribution which has a smaller standard deviation between the plural threshold voltage distributions, and
send the change of the read voltage to the memory device, wherein the voltage supply circuit is further configured to:
adjust a level of the read voltage based on the change of the read voltage, and
apply the adjusted level of the read voltage to the plurality of non-volatile memory cells.

16. The memory system according to claim 15, wherein the memory device comprises a table including information regarding how to determine a level of at least one read voltage applicable to the plurality of non-volatile memory cells.

17. The memory system according to claim 15, wherein the change of the read voltage is determined based on the mean difference when the standard deviation ratio is equal to or less than the preset threshold value.

18. The memory system according to claim 15, wherein the change of the read voltage is determined to correspond to a level, at which a number of non-volatile memory cells is minimum in a sum of the plural threshold voltage distributions when the standard deviation ratio is equal to or less than the preset threshold value.

19. The memory system according to claim 15,
wherein the mean difference is a difference between mean values of the plural threshold voltage distributions, and
wherein the controller is configured to determine the read voltage level based on a standardized value obtained by dividing a difference between a previous read voltage level and the mean difference by a standard deviation regarding one of the plural threshold voltage distributions.

20. The memory system according to claim 15, wherein the controller is configured to, when the standard deviation ratio is greater than the preset threshold value, determine the read voltage level by a procedure of:
subtracting a bias voltage level corresponding to a boundary value of a lowest section between the plural threshold voltage distributions from the previous read voltage level to obtain a subtracted value;
dividing the subtracted value by the standard deviation regarding the one of the plural threshold voltage distributions to obtain a divided value; and
adding the boundary value to a value obtained by multiplying the divided value by the standard deviation ratio, a result of the adding being the read voltage level.

* * * * *